United States Patent
Li et al.

(10) Patent No.: US 11,995,516 B2
(45) Date of Patent: May 28, 2024

(54) QUBIT DEVICES COMPRISING ONE OR MORE POLYCRYSTALLINE OR SINGLE CRYSTALLINE SPIN-TRIPLET SUPERCONDUCTORS

(71) Applicant: THE JOHNS HOPKINS UNIVERSITY, Baltimore, MD (US)

(72) Inventors: Yufan Li, Baltimore, MD (US); Xiaoying Xu, Baltimore, MD (US); Chia-Ling Chien, Baltimore, MD (US)

(73) Assignee: THE JOHNS HOPKINS UNIVERSITY, Baltimore, MD (US)

( * ) Notice: Subject to any disclaimer, the term of this patent is extended or adjusted under 35 U.S.C. 154(b) by 376 days.

(21) Appl. No.: 17/610,395

(22) PCT Filed: May 13, 2020

(86) PCT No.: PCT/US2020/032591
§ 371 (c)(1),
(2) Date: Nov. 10, 2021

(87) PCT Pub. No.: WO2020/232065
PCT Pub. Date: Nov. 19, 2020

(65) Prior Publication Data
US 2022/0245501 A1 Aug. 4, 2022

Related U.S. Application Data

(60) Provisional application No. 62/847,028, filed on May 13, 2019.

(51) Int. Cl.
*G06N 10/40* (2022.01)
*G01R 33/035* (2006.01)
*H10N 60/85* (2023.01)

(52) U.S. Cl.
CPC ......... *G06N 10/40* (2022.01); *G01R 33/0354* (2013.01); *H10N 60/85* (2023.02)

(58) Field of Classification Search
CPC ..... G06N 10/40; H01N 60/85; G01R 33/0354
See application file for complete search history.

(56) References Cited

U.S. PATENT DOCUMENTS 6,459,097 B1 10/2002 Zagoskin
6,495,854 B1 12/2002 Newns et al.
(Continued)

FOREIGN PATENT DOCUMENTS

RU 2538296 C2 1/2015

OTHER PUBLICATIONS

Xu et. al., "Spin-triplet pairing state evidenced by half-quantum flux in a noncentrosymmetric superconductor", 13 pages. (Year: 2020).*
(Continued)

*Primary Examiner* — Hai L Nguyen
(74) *Attorney, Agent, or Firm* — MH2 TECHNOLOGY LAW GROUP LLP

(57) ABSTRACT

A qubit device may include a closed loop comprising one or more polycrystalline spin-triplet superconductors. The closed loop may maintain a half-quantum magnetic flux in a ground state. A qubit device may include a closed loop comprising one or more single crystalline spin-triplet superconductors connected by one or more s-wave superconductors. The closed loop may maintain a half-quantum magnetic flux in a ground state.

20 Claims, 8 Drawing Sheets

(56) References Cited

U.S. PATENT DOCUMENTS

| | | | |
|---|---|---|---|
| 6,987,282 | B2 | 1/2006 | Amin et al. |
| 11,355,690 | B2 * | 6/2022 | Black ................ H10N 60/128 |
| 2015/0242758 | A1 | 8/2015 | Bonderson et al. |
| 2016/0300155 | A1 | 10/2016 | Betz et al. |
| 2017/0147939 | A1 | 5/2017 | Dzurak et al. |

OTHER PUBLICATIONS

International Search Report and Written Opinion in corresponding International Application No. PCT/US2020/032591 dated Nov. 5, 2020, 6 pages.
Van der Wal et al., "Quantum Superposition of Macroscopic Persistent-Current States," Science, vol. 290, pp. 773-777 (Oct. 27, 2000).
International Preliminary Report on Patentability in corresponding Application No. PCT/US2020/032591 dated Nov. 16, 2021, 4 pages.

* cited by examiner

QUBIT DEVICES COMPRISING ONE OR MORE POLYCRYSTALLINE OR SINGLE CRYSTALLINE SPIN-TRIPLET SUPERCONDUCTORS

CROSS-REFERENCE TO RELATED APPLICATION(S)

This application is a national stage entry from International Application No. PCT/US2020/032591, filed on May 13, 2020, in the Receiving Office ("RO/US") of the U.S. Patent and Trademark Office ("USPTO"), and published as International Publication No. WO 2020/232065 A2 on Nov. 19, 2020. International Application No. PCT/US2020/032591 claims the benefit under 35 U.S.C. § 119(e) of U.S. provisional patent application No. 62/847,028, filed on May 13, 2019, in the USPTO. The entire contents of the above-listed applications are incorporated herein by reference.

STATEMENT OF GOVERNMENTAL SUPPORT

This invention was made with government support under Award Grant No. DESC0009390, awarded by the U.S. Department of Energy ("DOE"), Basic Energy Science. This invention was also partially supported by Spins and Heat in Nanoscale Electronic Systems ("SHINES"), an Energy Frontier Research Center ("EFRC") funded by the U.S. DOE, Basic Energy Science, under Award Grant No. SC0012670. The government has certain rights in the invention.

FIELD

Some example embodiments relate to qubit devices that comprise closed loops comprising one or more polycrystalline spin-triplet superconductors. The closed loops can maintain a half-quantum magnetic flux in a ground state.

Some example embodiments relate to qubit devices that comprise closed loops comprising one or more single crystalline spin-triplet superconductors connected by one or more s-wave superconductors. The closed loops can maintain a half-quantum magnetic flux in a ground state.

BACKGROUND

A quantum bit ("qubit") is a basic building block of quantum computing. Similar to a conventional binary bit of a von Neumann-architecture that conveys values of "0" and "1", a qubit has two basis states of $|0\rangle$ and $|1\rangle$. However, unlike conventional binary bits that carry only two definitive values (e.g., either "0" or "1"), a qubit can stay at a superposition of the $|0\rangle$ and $|1\rangle$ basis states.

An arbitrary state of a qubit can be expressed as $|\Psi\rangle = a|0\rangle + b|1\rangle$, where a and b are the coefficients that determine the probabilities of the qubit occupying the corresponding basis states. A read-out of the qubit measures its quantum state, which results a collapse of the superposition to either one of the two basis states $|0\rangle$ and $|1\rangle$, depending on their probabilities $|a|^2$ and $|b|^2$.

Theoretically, a qubit can handle more information than a conventional bit because of the massive multiplication of the qubit states by the superposition of the two basis states. For example, in principle, a quantum computer with N qubits may be equivalent to a von Neumann-architecture computer with $2^N$ conventional binary bits, from which originates the quantum supremacy.

A challenge for realizing practical qubits is to find a suitable macroscopic system that manifests quantum mechanical behavior, but is not restricted to microscopic scales. One approach to this challenge is the use of superconducting devices. For example, a superconducting ring on the order of one micron ("μm") in diameter can exhibit quantum behavior.

The principle of superconductivity provides that the magnetic flux passing through the superconducting ring can only be changed in discrete steps of one flux quantum $\psi_0$, where $\psi_0 = hc/2e$ (in centimeter-gram-second ("CGS") units) or $\psi_0 = h/2e$ (in the International System of Units ("SI")). So the allowed quantized values in a typical superconducting ring correspond to $\psi/n\psi_0$, where n=0, 1, 2, 3, etc.

Under an arbitrary external magnetic field applying a magnetic flux to the superconducting ring, the superconducting ring should sustain a circulating supercurrent to compensate for the applied magnetic flux, so that the overall magnetic flux takes on the allowed quantized values. In particular, the half quantum-flux state of $\frac{1}{2}\psi_0$ is important. At this point, the current-induced flux—compensating for the applied magnetic flux—takes on its maximum allowed value of $\frac{1}{2}\psi_0$. However, the circulation direction of the supercurrent can assume either of the two opposite directions, which are energetically degenerate. In this way, a superposition of two quantum states can be realized in a macroscopic object, the superconducting ring.

Although it is possible to apply an external magnetic field so that the applied magnetic flux is almost exactly $\frac{1}{2}\psi_0$ (the middle point between two allowed quantized values of the overall magnetic flux), the precision required by this constraint is a serious drawback.

In an article published in Science Magazine on Oct. 27, 2000 [Science, Vol. 290, pp. 773-777], van der Wal et al. discussed a mesoscopic superconducting ring with three aluminum oxide Josephson junctions. The mesoscopic superconducting ring was made of aluminum, a conventional s-wave superconductor. As discussed above, the allowed quantized values in this mesoscopic superconducting ring—and for most superconducting materials in general—correspond to $\psi = n\psi_0$, where n=0, 1, 2, 3, etc.

Van der Wal et al. applied an external magnetic field that was perpendicular to the mesoscopic superconducting ring, so that $\psi_{ext} = \frac{1}{2}\psi_0$, and showed that in the vicinity of ±0.005 $\psi_0$ around the half-quantum magnetic flux state, the mesoscopic superconducting ring sits on a superposition of two states where the supercurrent circulates both clockwise and counter-clockwise. The probability of finding the ring in a particular state can be tuned by the applied flux, that is if $\psi_{ext}$ is slightly greater or slightly smaller than $\frac{1}{2}\psi_0$.

The state of the mesoscopic superconducting ring of van der Wal et al. can be read out by an inductance-coupled DC-SQUID loop. Such a device manifests all the basic functionalities of a qubit.

However, there is a formidable obstacle for application of such a mesoscopic superconducting ring. The obstacle relates to the precise applied magnetic field required for proper operation. In particular, the applied external magnetic field should provide $(n+\frac{1}{2})\psi_0$, allowing only small deviations (on the order of 0.005 $\psi_0$). $\psi_0$ is approximately 20.7 Oe-(μm)$^2$ or approximately $2.07 \times 10^{-15}$ webers ("Wb"). For typical mesoscopic devices, this translate to a tolerance for the applied external magnetic field on the order of 0.1 oersted ("Oe") or $1 \times 10^{-5}$ tesla ("T").

In other words, a quantum computing device containing multiple such qubits must ensure that the magnetic fields for all of the qubits are the same, within an error no more than about 0.1 Oe or about $1 \times 10^{-5}$ T. This requires the dimensions of all of the qubits for the quantum computing device to be almost precisely the same, which is extremely difficult, if not impossible, because of inevitable variations among the qubits that occur in the fabrication process.

Attempts have been made to address the problems discussed above with respect to mesoscopic superconducting ring made of conventional s-wave superconductors. Such attempts have included d-wave superconductors using multi-crystal junctions (e.g., U.S. Pat. No. 6,495,854 B1 to Newns et al. ("Newns")), and Josephson junctions between d-wave and s-wave superconductors (e.g., U.S. Pat. No. 6,459,097 B1 to Zagoskin ("Zagoskin") and U.S. Pat. No. 6,987,282 B1 to Amin et al. ("Amin")).

In these systems, by controlling the crystalline orientation of the superconducting materials, it may be possible to shift the phase of the order parameter by 180° ($\pi$ radians) when crossing a selected junction. This added $\pi$-shift causes the allowed quantized values in the superconducting materials to correspond to $\psi=(n+\frac{1}{2})\psi_0$, where n=0, 1, 2, 3, etc. So the minimum amplitude of $\psi$ is $\frac{1}{2}\psi_0$, achieved when the applied external magnetic field is absent or close to zero, and the $\pi$-ring can sustain a circulating supercurrent at its ground state.

Problems with these systems are inherent to the properties of d-wave superconductors (e.g., cuprate oxides). The coherent length in these materials is usually extremely short (e.g., on the order of 1 nanometer ("nm")). In addition, the high temperatures required for synthesizing the associated oxides poses difficulties for integrating d-wave superconductors into existing industrial processes.

Therefore, a more practical approach for building half-quantum qubit devices (e.g., n-loops) is desired. Such an approach should offer similar levels of accessibility for reading, writing, and ease of operation as those in the art, but should be more scalable and easier to integrate into existing semiconductor information technology ("IT") industrial production processes.

SUMMARY

In some example embodiments, a qubit device can comprise: a closed loop comprising one or more polycrystalline spin-triplet superconductors. The closed loop can maintain a half-quantum magnetic flux in a ground state. In some example embodiments, the qubit device can comprise: a closed loop comprising one or more polycrystalline p-wave superconductors. In some example embodiments, the qubit device can comprise: a closed loop comprising one or more polycrystalline f-wave superconductors. In some example embodiments, the qubit device can comprise: a closed loop comprising one or more polycrystalline p-wave superconductors and one or more polycrystalline f-wave superconductors.

In some example embodiments, the device can further comprise: a magnetometer configured to detect a status of the closed loop.

In some example embodiments, the magnetometer can comprise a superconducting quantum interference device ("SQUID").

In some example embodiments, the shape of the closed loop can be a circle, an oval, a square, a rectangle, a quadrilateral, a pentagon, a hexagon, a heptagon, or an octagon.

In some example embodiments, a maximum overall width of the closed loop can be greater than or equal to 1 nm and less than or equal to 1 millimeter ("mm").

In some example embodiments, the one or more polycrystalline spin-triplet superconductors can comprise one or more of $Bi_2Pd$, BiPd, $CaSn_3$, $Pb_2Pt$, $Sr_2RuO_4$, $PbTaSe_2$, $FeTe_xSe_{1-x}$ (0<x≤d1), $Cu_xBi_2Se_3$ (0<x≤1), $Nb_xBi_2Se_3$ (0<x≤1), $Sr_xBi_2Se_3$ (0<x≤1), $Ir_{1-x}Pt_xTe_2$ (0<x≤1), $Li_2Pt_3B$, MoN, SmN, $Li_{0.3}Ti_{1.1}S_2$, $Nb_xTc_{1-x}$ (0<x<1), ZrRuP, $Mo_3Al_2C$, MoC, $LaSB_2C_6$, ThIrSi, LaPtSi, $NbSe_2$, $Mo_3P$, LaRhSi, $La_3Rh_4Sn_{13}$, $CePt_3Si$, $LiPt_3B$, $UPt_3$, $CeRhSi_3$, $CeIrSi_3$, $CeCoGe_3$, $CeIrGe_3$, SrPtAs, PtAs, $URu_2Si_2$, $(Li_xFe_{1-x})OHFeSe$ (0<x≤1), Li(Fe,Co)As, $Pb_3Bi$, $U_{1-x}Th_xBe_{13}$ (0≤x≤1), YPtBi, LuPtBi, LaPtBi, YPdBi, LuPdBi, ErPdBi, DyPdBi, TmPdBi, SmPdBi, HoPdBi, or CePdBi.

In some example embodiments, the one or more polycrystalline spin-triplet superconductors can comprise $\beta$-$Bi_2Pd$.

In some example embodiments, the half-quantum magnetic flux in the ground state approximates $1.033917 \times 10^{-15}$ webers ("Wb").

In some example embodiments, a fluxoid quantization ($\psi$) of the closed loop can satisfy Equation I: $\psi=(n+\frac{1}{2})*\psi_0$ (Equation I), where 'n' is a whole number, where '$\psi_0$'=h/(2*e), where 'h' is Planck's constant, where 'e' is a charge on one electron, and all units are in the International System of Units ("SI"). In the alternative, '$\psi_0$'=(h*c)/(2*e), where 'c' is the speed of light, and all units are in the centimeter-gram-second ("CGS") system of units.

In some example embodiments, a qubit device can comprise: a closed loop comprising one or more single crystalline spin-triplet superconductors connected by one or more s-wave superconductors. The closed loop can maintain a half-quantum magnetic flux in a ground state. In some example embodiments, the qubit device can comprise: a closed loop comprising one or more single crystalline p-wave superconductors. In some example embodiments, the qubit device can comprise: a closed loop comprising one or more single crystalline f-wave superconductors. In some example embodiments, the qubit device can comprise: a closed loop comprising one or more single crystalline p-wave superconductors and one or more polycrystalline f-wave superconductors.

In some example embodiments, the device can further comprise: a magnetometer configured to detect a status of the closed loop.

In some example embodiments, the magnetometer can comprise a superconducting quantum interference device ("SQUID").

In some example embodiments, the shape of the closed loop can be a circle, an oval, a square, a rectangle, a quadrilateral, a pentagon, a hexagon, a heptagon, or an octagon.

In some example embodiments, a maximum overall width of the closed loop can be greater than or equal to 1 nm and less than or equal to 1 mm.

In some example embodiments, the one or more one or more single crystalline spin-triplet superconductors can comprise one or more of $Bi_2Pd$, BiPd, $CaSn_3$, $Pb_2Pt$, $Sr_2RuO_4$, $PbTaSe_2$, $FeTe_xSe_{1-x}$ (0<x≤1), $Cu_xBi_2Se_3$ (0<x≤1), $Nb_xBi_2Se_3$ (0<x≤1), $Sr_xBi_2Se_3$ (0<x≤1), $Ir_{1-x}Pt_xTe_2$ (0<x≤1), $Li_2Pt_3B$, MoN, SmN, $Li_{0.3}Ti_{1.1}S_2$, $Nb_xTc_{1-x}$ (0<x<1), ZrRuP, $Mo_3Al_2C$, MoC, $La_5B_2C_6$, ThIrSi, LaPtSi, $NbSe_2$, $Mo_3P$, LaRhSi, $La_3Rh_4Sn_{13}$, $CePt_3Si$, $LiPt_3B$, $UPt_3$, $CeRhSi_3$, $CeIrSi_3$, $CeCoGe_3$, $CeIrGe_3$, SrPtAs, PtAs, $URu_2Si_2$, $(Li_xFe_{1-x})OHFeSe$ (0<x≤1), Li(Fe,Co)As, $Pb_3Bi$, $U_{1-x}Th_xBe_{13}$ (0≤x≤1), YPtBi, LuPtBi, LaPtBi, YPdBi, LuPdBi, ErPdBi, DyPdBi, TmPdBi, SmPdBi, HoPdBi, or CePdBi.

In some example embodiments, the one or more single crystalline spin-triplet superconductors can comprise β-Bi$_2$Pd.

In some example embodiments, the one or more s-wave superconductors can comprise one or more of Al, Nb, Pb, Sn, Ta, or one or more alloys of Al, Nb, Pb, Sn, or Ta.

In some example embodiments, the half-quantum magnetic flux in the ground state approximates $1.033917 \times 10^{-15}$ webers ("Wb").

In some example embodiments, a fluxoid quantization (ψ) of the closed loop can satisfy Equation I: $\psi = (n + \frac{1}{2}) \ast \psi_0$ (Equation I), where 'n' is a whole number, where '$\psi_0$'=h/(2*e), where 'h' is Planck's constant, where 'e' is a charge on one electron, and all units are in the International System of Units ("SI"). In the alternative, '$\psi_0$'=(h*c)/(2*e), where 'c' is the speed of light, and all units are in the centimeter-gram-second ("CGS") system of units.

In some example embodiments, an odd number of connections between the one or more single crystalline spin-triplet superconductors and the one or more s-wave superconductors can be x-junctions.

BRIEF DESCRIPTION OF THE DRAWINGS

The accompanying drawings provide visual representations which will be used to more fully describe the representative embodiments disclosed herein and may be used by those skilled in the art to better understand them and their inherent advantages. In these drawings, like reference numerals identify corresponding elements and.

DETAILED DESCRIPTION

Figure 1A:
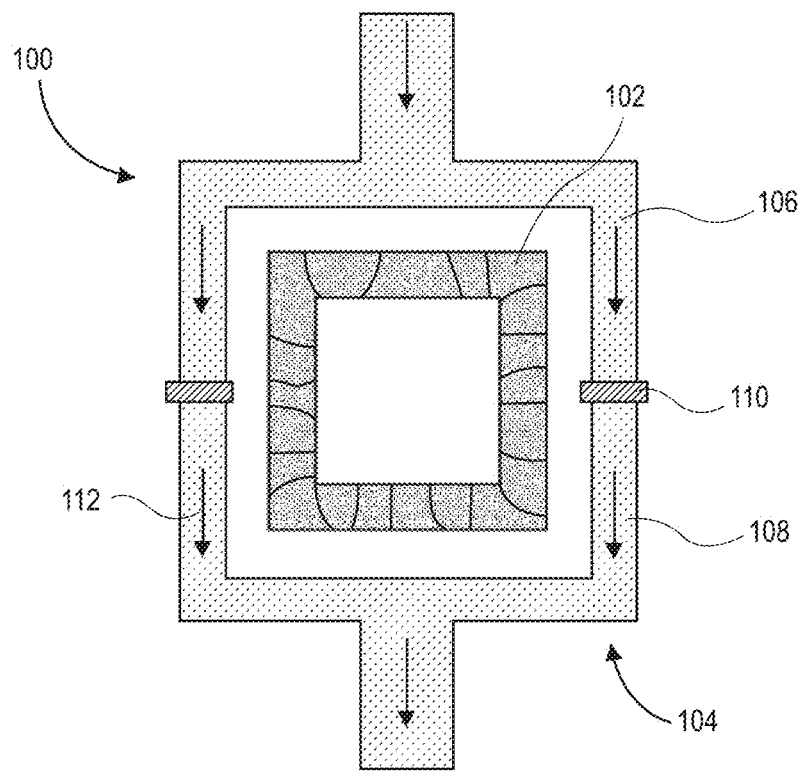
FIG. 1A is a schematic illustration of a qubit device according to some example embodiments.

Example embodiments will now be described more fully with reference to the accompanying drawings. Example embodiments, however, may be embodied in many different forms and should not be construed as being limited to the examples set forth herein. Rather, these examples are provided so that this disclosure will be thorough and complete, and will fully convey the scope to those skilled in the art. In the drawings, some details may be simplified and/or may be drawn to facilitate understanding rather than to maintain strict structural accuracy, detail, and/or scale. For example, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items. It will be understood that although the terms first, second, third, etc., may be used herein to describe various elements, components, regions, layers, and/or sections, these elements, components, regions, layers, and/or sections should not be limited by these terms.

These terms are only used to distinguish one element, component, region, layer, and/or section from another element, component, region, layer, and/or section. For example, a first element, component, region, layer, or section could be termed a second element, component, region, layer, or section without departing from the teachings of examples. Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation(s) depicted in the figures.

The terminology used herein is for the purpose of describing particular examples only and is not intended to be limiting of examples. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which examples belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

As known to a person having ordinary skill in the art ("PHOSITA"), a superconducting wave function comprises both a spin component and an orbital component. The spin component can be in a spin-singlet state (Cooper pairs with opposite spin; spin quantum number s=0) or in a spin-triplet state (Cooper pairs with the same spin; spin quantum number s=1). The orbital component can have angular momentum l=0 (s-orbital), l=1 (p-orbital), l=2 (d-orbital), l=3 (f-orbital), etc. Accordingly, an s-wave superconductor corresponds to s=0, l=0; a p-wave superconductor corresponds to s=1, l=1: a d-wave superconductor corresponds to s=0, l=2: and an f-wave superconductor corresponds to s=1, l=3. Thus, s-wave and d-wave superconductors are spin-singlet superconductors, while p-wave and f-wave superconductors are spin-triplet superconductors.

FIG. 1A is a schematic illustration of qubit device 100 (e.g., half-quantum flux qubit) according to some example embodiments.

As shown in FIG. 1A, qubit device 100 comprises closed loop 102 comprising one or more polycrystalline spin-triplet superconductors (e.g., one or more polycrystalline p-wave superconductors, one or more polycrystalline f-wave superconductors, or one or more polycrystalline p-wave superconductors and one or more polycrystalline f-wave superconductors). Closed loop 102 can maintain a half-quantum magnetic flux in a ground state, which—with no applied external magnetic field—is the superposition of two states with the polarity of a half magnetic flux either pointing up or down, perpendicular to the plane of closed loop 102, in which a spontaneous supercurrent flows.

The ground state of the supercurrent circulating in closed loop 102 is doubly degenerate, with two distinct circulating current directions, as well as their associated induced magnetic moments. Therefore, qubit device 100 rests on the superposition of the two degenerate ground states, which can support quantum computing. Without wishing to be bound by theory, it is believed that the operation of qubit device 100 is facilitated by junctions (e.g., an odd number of n-junctions) of multiple crystal grains of the one or more polycrystalline spin-triplet superconductors.

As also known to a PHOSITA, closed loop 102 can be fabricated on a substrate (not shown) using, for example, E-beam lithography, photolithography, magnetron sputtering, high-vacuum sputtering system (e.g., base vacuum of about $1 \times 10^{-8}$ Torr), molecular-beam epitaxy ("MBE"), pulsed laser deposition ("PLD"), or similar techniques suitable for forming π-junctions.

Closed loop 102 can comprise one or more layers of one or more polycrystalline spin-triplet superconductors (e.g., a single layer of a polycrystalline spin-triplet superconductor). The one or more layers can comprise thin films of the one or more polycrystalline spin-triplet superconductors.

The one or more polycrystalline spin-triplet superconductors can comprise one or more of $Bi_2Pd$, $BiPd$, $CaSn_3$, $Pb_2Pt$, $Sr_2RuO_4$, $PbTaSe_2$, $FeTe_xSe_{1-x}$ (0<x≤1) (e.g., $FeTe_{0.55}Se_{0.45}$), $Cu_xBi_2Se_3$ (0<x≤1), $Nb_xBi_2Se_3$ (0<x≤1), $Sr_xBi_2Se_3$ (0<x≤1), $Ir_{1-x}Pt_xTe_2$ (0<x≤1), $Li_2Pt_3B$, MoN, SmN, $Li_{0.3}Ti_{1.1}S_2$, $Nb_xTc_{1-x}$ (0<x<1) (e.g., $Nb_{0.24}Tc_{0.76}$), ZrRuP, $Mo_3Al_2C$, MoC, $La_5B_2C_6$, ThIrSi, LaPtSi, $NbSe_2$, $Mo_3P$, LaRhSi, $La_3Rh_4Sn_{13}$, $CePt_3Si$, $LiPt_3B$, $UPt_3$, $CeRhSi_3$, $CeIrSi_3$, $CeCoGe_3$, $CeIrGe_3$, $SrPtAs$, PtAs, $URu_2Si_2$, $(Li_xFe_{1-x})OHFeSe$ (0<x≤1) (e.g., $(Li_{0.84}Fe_{0.16})OHFeSe$), Li(Fe,Co)As, $Pb_3Bi$, $U_{1-x}Th_xBe_{13}$ (0≤x≤1), YPtBi, LuPtBi, LaPtBi, YPdBi, LuPdBi, ErPdBi, DyPdBi, TmPdBi, SmPdBi, HoPdBi, or CePdBi [per the Periodic Table of the Elements: aluminum ("Al"), arsenic ("As"), boron ("B"), beryllium ("Be"), bismuth ("Bi"), carbon ("C"), calcium ("Ca"), cerium ("Ce"), cobalt ("Co"), copper ("Cu"), dysprosium ("Dy"), erbium ("Er"), iron ("Fe"), germanium ("Ge"), hydrogen ("H"), holmium ("Ho"), iridium ("Ir"), lanthanum ("La"), lithium ("Li"), lutetium ("Lu"), molybdenum ("Mo"), nitrogen ("N"), niobium ("Nb"), oxygen ("O"), phosphorus ("P"), lead ("Pb"), palladium ("Pd"), platinum ("Pt"), rhodium ("Rh"), ruthenium ("Ru"), sulfur ("S"), selenium ("Se"), silicon ("Si"), samarium ("Sm"), tin ("Sn"), strontium ("Sr"), tantalum ("Ta"), technetium ("Tc"), tellurium ("Te"), thorium ("Tb"), titanium ("Ti"), thulium ("Tm"), uranium ("U"), yttrium ("Yt"), and zirconium ("Zr")]. The one or more polycrystalline spin-triplet superconductors can comprise, for example, $β-Bi_2Pd$, possibly in the form of thin films or textured thin films (e.g., (001)-textured).

Figure 1B:
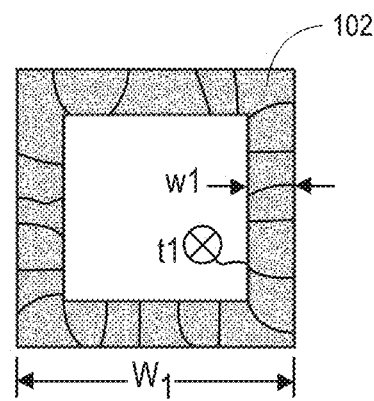
FIG. 1B is a schematic illustration of a closed loop of the qubit device of FIG. 1A according to some example embodiments.

FIG. 1B is a schematic illustration of closed loop 102 of qubit device 100 according to some example embodiments.

There is no limitation on the shape of closed loop 102 as long as closed loop 102 forms an enclosed structure. For example, the shape of closed loop 102 can be a circle, an oval, a square, a rectangle, a quadrilateral, a pentagon, a hexagon, a heptagon, or an octagon.

As shown in FIG. 1B, closed loop 102 can have, for example, a maximum overall width W1 greater than or equal to 1 nm and less than or equal to 1 mm. Closed loop 102 can have a maximum overall width W1 greater than or equal to 1 nm and less than or equal to 10 nm. Closed loop 102 can have a maximum overall width W1 greater than or equal to 10 nm and less than or equal to 100 nm. Closed loop 102 can have a maximum overall width W1 greater than or equal to 100 nm and less than or equal to 20 μm. Closed loop 102 can have, for example, a width between midpoints of opposing walls of about 450 nm, about 690 nm, about 800 nm, about 900 nm, about 1,000 nm, or about 1,500 nm.

As also shown in FIG. 1B, the walls of closed loop 102 can have, for example, a maximum thickness t1 (measured into or out of the plane of closed loop 102) greater than or equal to 10 nm and less than or equal to 2 μm. The walls of closed loop 102 can have a maximum thickness t1 greater than or equal to 20 nm and less than or equal to 100 nm. Closed loop 102 can have a maximum thickness t1 of about 28 nm. Closed loop 102 can have a maximum thickness t1 of about 50 nm.

Additionally, as shown in FIG. 1B, the walls of closed loop 102 can have, for example, a maximum wall width w1 greater than or equal to 0.5 nm and less than or equal to 10 μm. Closed loop 102 can have a maximum wall width w1 of about 50 nm, about 100 nm, about 200 nm, about 300 nm, about 400 nm, about 500 nm, or about 535 nm.

Further, as shown in FIGS. 1A and 1B, closed loop 102 can have, for example, polycrystalline grain boundaries with random distribution.

The substrate can be, for example, a thermally oxidized silicon substrate (e.g., silicon dioxide ("SiO$_2$") substrate), MgO, SrTiO$_3$, or other substrate compatible with closed loop 102 [per the Periodic Table of the Elements: magnesium ("Mg")]. The substrate can be textured (e.g., (001)-textured). Such texturing can be the same as or different from texturing associated with the one or more polycrystalline spin-triplet superconductors.

As known to a PHOSITA, closed loop 102 can be covered by a protective layer (not shown). The protective layer can be MgO or other suitable material, compatible with closed loop 102, that can protect closed loop 102 from, for example, oxidation in subsequent processing (such as lithography). The protective layer can be, for example, on the order of 1 nm thick.

As shown in FIG. 1A, qubit device 100 can further comprise magnetometer 104 configured to detect a status of closed loop 102. Magnetometer 104 can comprise superconducting material 106, superconducting material 108, and weak links 110.

Magnetometer 104 can comprise a superconducting quantum interference device ("SQUID"). In a SQUID, superconducting material 106 and/or superconducting material 108 can comprise one or more s-wave superconductors, one or more p-wave superconductors, one or more d-wave superconductors, and/or one or more f-wave superconductors. The one or more s-wave superconductors can comprise one or more of Al, Nb, Pb, Sn, or Ta, or one or more alloys of Al, Nb, Pb, Sn, or Ta. In a SQUID, weak links 110 can comprise thin insulating barriers (known as a superconductor-insulator-superconductor junction, or "S-I-S"), short sections of non-superconducting metal ("S—N—S"), or physical constrictions that weaken the superconductivity at the point of contact ("S-s-S").

Weak links 110 can comprise one or more metals, such as Ag, Au, Cu, Pd, or Pt [per the Periodic Table of the Elements, silver ("Ag") and gold ("Au")]. Weak links 110 can comprise one or more insulators, such as $Al_2O_3$, MgO, or $SiO_2$.

Magnetometer 104 can read out the status of closed loop 102. In the case of a SQUID, direct current can flow through superconducting material 106, superconducting material 108, and weak links 110 in order to read out the status of closed loop 102. The direct current can flow in the direction of arrows 112, as shown in FIG. 1A, or in the direction opposite to the direction of arrows 112. As known to a PHOSITA, the status of closed loop 102 also can be read out by examining the direction of the supercurrent flowing through superconducting material 106, superconducting material 108, and/or weak links 110.

Figure 2A:
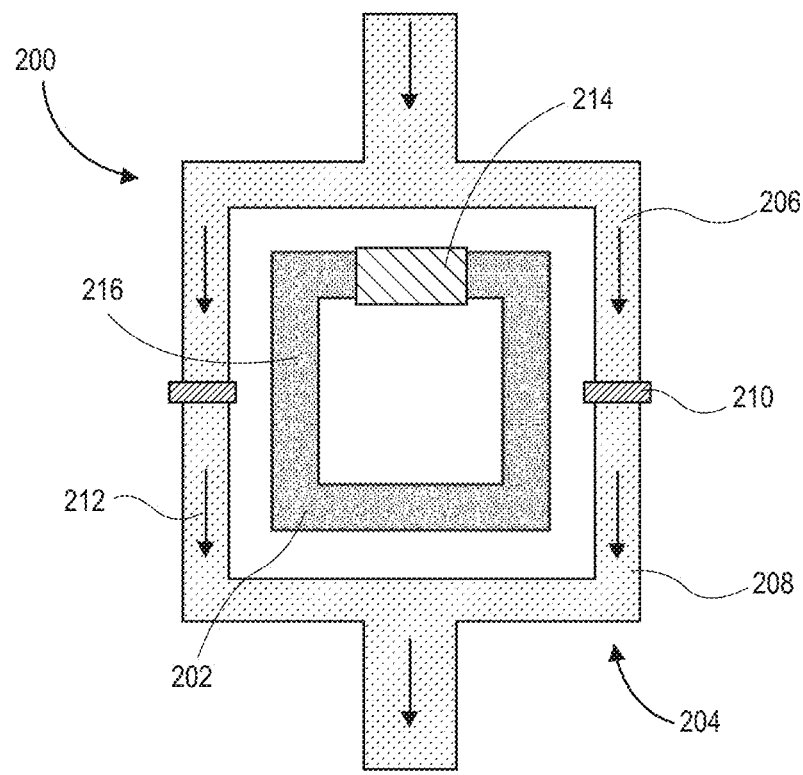
FIG. 2A is a schematic illustration of a qubit device according to some example embodiments.

FIG. 2A is a schematic illustration of qubit device 200 (e.g., half-quantum flux qubit) according to some example embodiments.

As shown in FIG. 2A, qubit device 200 comprises closed loop 202 comprising one or more single crystalline spin-triplet superconductors 214 (e.g., one or more single crystalline p-wave superconductors, one or more single crystalline f-wave superconductors, or one or more single crystalline p-wave superconductors and one or more single crystalline f-wave superconductors) connected by one or more s-wave superconductors 216. Closed loop 202 can maintain a half-quantum magnetic flux in a ground state, which—with no applied external magnetic field—is the superposition of two states with the polarity of a half magnetic flux either pointing up or down, perpendicular to the plane of closed loop 202, in which a spontaneous supercurrent flows.

The ground state of the supercurrent circulating in closed loop 202 is doubly degenerate, with two distinct circulating current directions, as well as their associated induced magnetic moments. Therefore, qubit device 200 rests on the superposition of the two degenerate ground states, which can support quantum computing. Without wishing to be bound by theory, it is believed that the operation of qubit device 200 is facilitated by junctions (e.g., an odd number of π-junctions) of the one or more single crystalline spin-triplet superconductors 214 and the one or more s-wave superconductors 216. In FIG. 2A, for example, one of the two junctions between the one or more single crystalline spin-triplet superconductors 214 and the one or more s-wave superconductors 216 can be a π-junction.

As known to a PHOSITA, closed loop 202 can be fabricated on a substrate (not shown) using, for example, E-beam lithography, photolithography, magnetron sputtering, high-vacuum sputtering system (e.g., base vacuum of about $1 \times 10^{-8}$ Torr), molecular-beam epitaxy ("MBE"), pulsed laser deposition ("PLD"), or similar techniques suitable for forming π-junctions.

Closed loop 202 can comprise one or more layers of one or more single crystalline spin-triplet superconductors 214 (e.g., a single layer of a single crystalline spin-triplet superconductor) and one or more layers of one or more first s-wave superconductors 216. The one or more layers of the one or more single crystalline spin-triplet superconductors 214 can comprise thin films of the one or more single crystalline spin-triplet superconductors 214. The one or more layers of the one or more first s-wave superconductors 216 can comprise thin films of the one or more first s-wave superconductors 216.

The one or more single crystalline spin-triplet superconductors 214 can comprise one or more of $Bi_2Pd$, BiPd, $CaSn_3$, $Pb_2Pt$, $Sr_2RuO_4$, $PbTaSe_2$, $FeTe_xSe_{1-x}$ (0<x≤1) (e.g., $FeTe_{0.55}Se_{0.45}$), $Cu_xBi_2Se_3$ (0<x≤1), $Nb_xBi_2Se_3$ (0<x≤1), $Sr_xBi_2Se_3$ (0<x≤1), $Ir_{1-x}Pt_xTe_2$ (0<x≤1), $Li_2Pt_3B$, MoN, SmN, $Li_{0.3}Ti_{1.1}S_2$, $Nb_xTc_{1-x}$ (0<x<1) (e.g., $Nb_{0.24}Tc_{0.76}$), ZrRuP, $Mo_3Al_2C$, MoC, $LasB_2C_6$, ThIrSi, LaPtSi, $NbSe_2$, $Mo_3P$, LaRhSi, $La_3Rh_4Sn_{13}$, $CePt_3Si$, $LiPt_3B$, $UPt_3$, $CeRhSi_3$, $CeIrSi_3$, $CeCoGe_3$, $CeIrGe_3$, SrPtAs, PtAs, $URu_2Si_2$, $(Li_xFe_{1-x})OHFeSe$ (0<x≤1) (e.g., $(Li_{0.84}Fe_{0.16})OHFeSe$), Li(Fe,Co)As, $Pb_3Bi$, $U_{1-x}Th_xBe_{13}$ (0≤x≤1), YPtBi, LuPtBi, LaPtBi, YPdBi, LuPdBi, ErPdBi, DyPdBi, TmPdBi, SmPdBi, HoPdBi, or CePdBi. The one or more single crystalline spin-triplet superconductors 214 can comprise, for example, β-$Bi_2Pd$, possibly in the form of thin films or textured thin films (e.g., (001)-textured).

The one or more first s-wave superconductors 216 can comprise one or more of Al, Nb, Pb, Sn, or Ta, or one or more alloys of Al, Nb, Pb, Sn, or Ta.

Figure 2B:
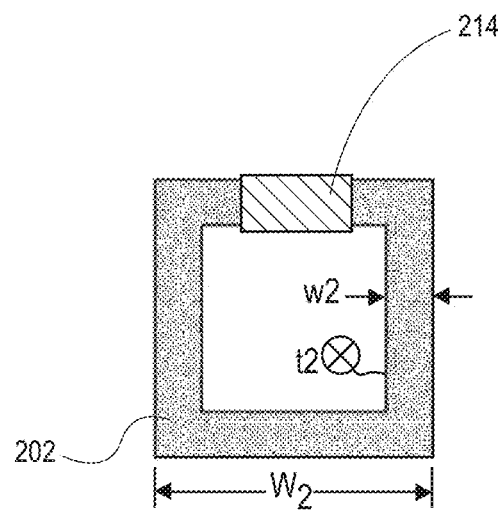
FIG. 2B is a schematic illustration of a closed loop of the qubit device of FIG. 2A according to some example embodiments.

FIG. 2B is a schematic illustration of closed loop 202 of qubit device 200 according to some example embodiments.

There is no limitation on the shape of closed loop 202 as long as closed loop 202 forms an enclosed structure. For example, the shape of closed loop 202 can be a circle, an oval, a square, a rectangle, a quadrilateral, a pentagon, a hexagon, a heptagon, or an octagon.

Closed loop 202 can have, for example, a maximum overall width W2 greater than or equal to 1 nm and less than or equal to 1 mm. Closed loop 202 can have a maximum overall width W2 greater than or equal to 1 nm and less than or equal to 10 nm. Closed loop 202 can have a maximum overall width W2 greater than or equal to 10 nm and less than or equal to 200 nm. Closed loop 202 can have a maximum overall width W2 greater than or equal to 100 nm and less than or equal to 20 μm. Closed loop 202 can have, for example, a width between midpoints of opposing walls of about 450 nm, about 690 nm, about 800 nm, about 900 nm, about 1.000 nm, or about 1,500 nm.

As also shown in FIG. 2B, the walls of closed loop 202 can have, for example, a maximum thickness t2 (measured into or out of the plane of closed loop 202) greater than or equal to 10 nm and less than or equal to 2 μm. The walls of closed loop 202 can have a maximum thickness t2 greater than or equal to 20 nm and less than or equal to 100 nm. Closed loop 202 can have a maximum thickness t2 of about 28 nm. Closed loop 202 can have a maximum thickness t2 of about 50 nm.

Additionally, as shown in FIG. 2B, the walls of closed loop 202 can have, for example, a maximum wall width w2 greater than or equal to 0.5 nm and less than or equal to 10 μm. Closed loop 202 can have a maximum wall width w2 of about 50 nm, about 100 nm, about 200 nm, about 300 nm, about 400 nm, about 500 nm, or about 535 nm.

The substrate can be, for example, a thermally oxidized silicon substrate (e.g., $SiO_2$ substrate), MgO, $SrTiO_3$, or other substrate compatible with closed loop 202. The substrate can be textured (e.g., (001)-textured). Such texturing can be the same as or different from texturing associated with the one or more polycrystalline spin-triplet superconductors.

As known to a PHOSITA, closed loop 202 can be covered by a protective layer (not shown). The protective layer can be MgO or other suitable material, compatible with closed loop 202, that can protect closed loop 202 from, for example, oxidation in subsequent processing (such as lithography). The protective layer can be, for example, on the order of 1 nm thick.

As shown in FIG. 2A, qubit device 200 can further comprise magnetometer 204 configured to detect a status of closed loop 202. Magnetometer 204 can comprise superconducting material 206, superconducting material 208, and weak links 210.

Magnetometer 204 can comprise a SQUID. In a SQUID, superconducting material 206 and/or superconducting material 208 can comprise one or more second s-wave superconductors, one or more p-wave superconductors, one or more d-wave superconductors, and/or one or more f-wave superconductors. The one or more second s-wave superconductors can comprise one or more of Al, Nb, Pb, Sn, or Ta, or one or more alloys of Al, Nb, Pb, Sn, or Ta. In a SQUID, weak links 210 can comprise thin insulating barriers (known as a superconductor-insulator-superconductor junction, or "S-I-S"), short sections of non-superconducting metal ("S-N-S"), or physical constrictions that weaken the superconductivity at the point of contact ("S-s-S").

Weak links 210 can comprise one or more metals, such as Ag, Au, Cu, Pd, or Pt. Weak links 210 can comprise one or more insulators, such as $Al_2O_3$, MgO, or $SiO_2$.

Magnetometer 204 can read out the status of closed loop 202. In the case of a SQUID, direct current can flow through superconducting material 206, superconducting material 208, and weak links 210 in order to read out the status of closed loop 202. The direct current can flow in the direction of arrows 212, as shown in FIG. 2A, or in the direction opposite to the direction of arrows 212. As known to a PHOSITA, the status of closed loop 202 also can be read out by examining the direction of the supercurrent flowing through superconducting material 206, superconducting material 208, and/or weak links 210.

EXAMPLES

The following example embodiments have been included to provide guidance to a PHOSITA for practicing representative embodiments of the presently disclosed subject matter. In light of the present disclosure and the general level of skill in the art, a PHOSITA may appreciate that the following examples are intended to be exemplary only and that numerous changes, modifications, and alterations may be employed without departing from the scope of the presently disclosed subject matter. The following examples are offered by way of illustration and not by way of limitation.

Figure 3A:
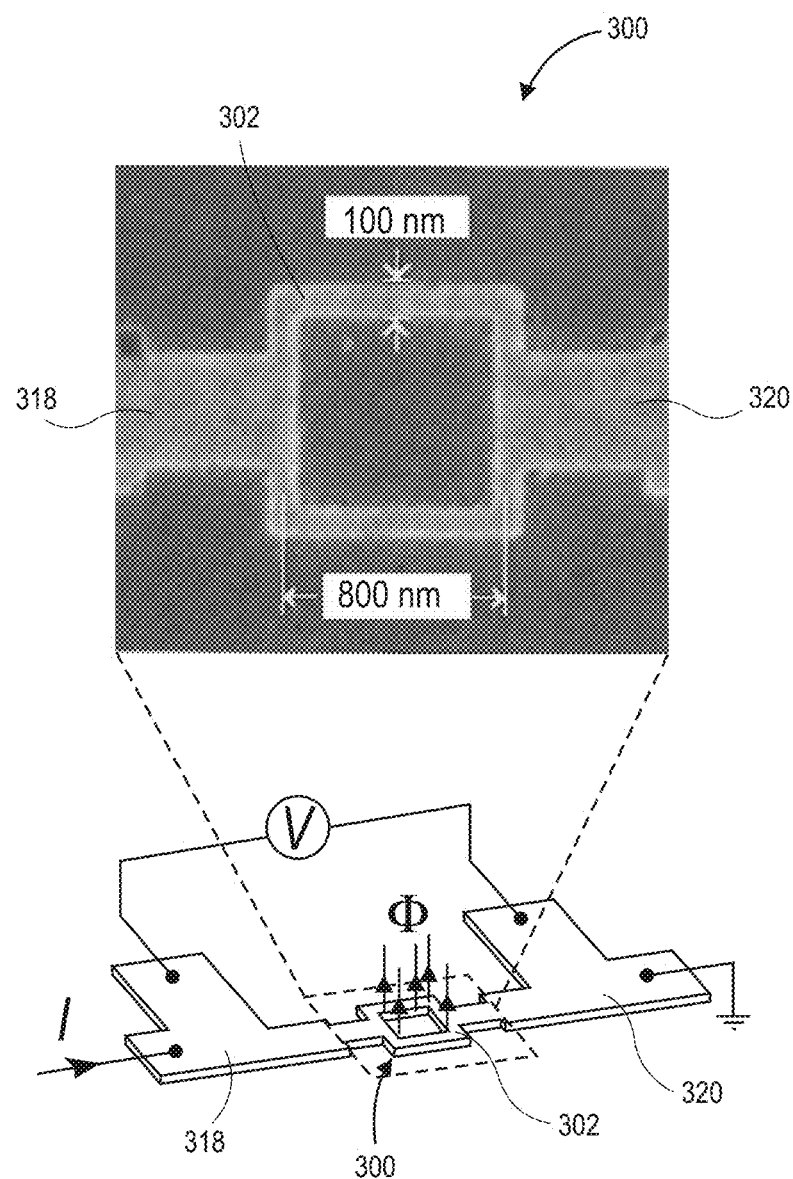
FIG. 3A is a schematic illustration of a qubit device according to some example embodiments.
Figure 3B:
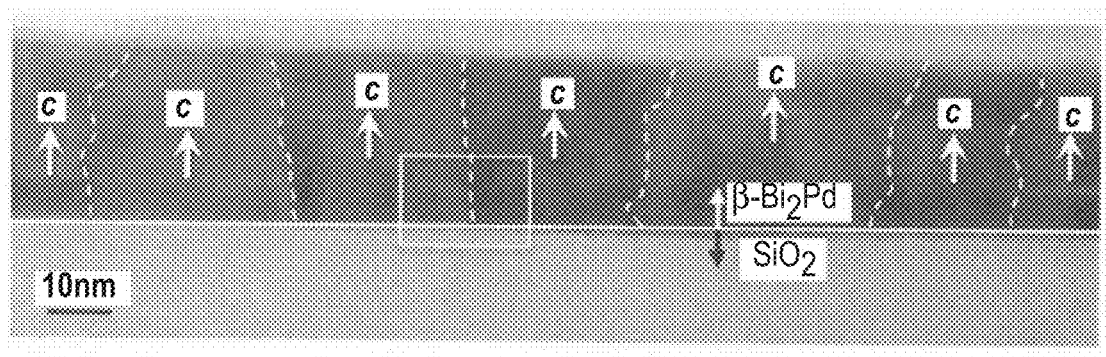
FIGS. 3B-3D are transmission electron microscopy ("TEM") images of the qubit device of FIG. 3A according to some example embodiments.
Figure 3C:
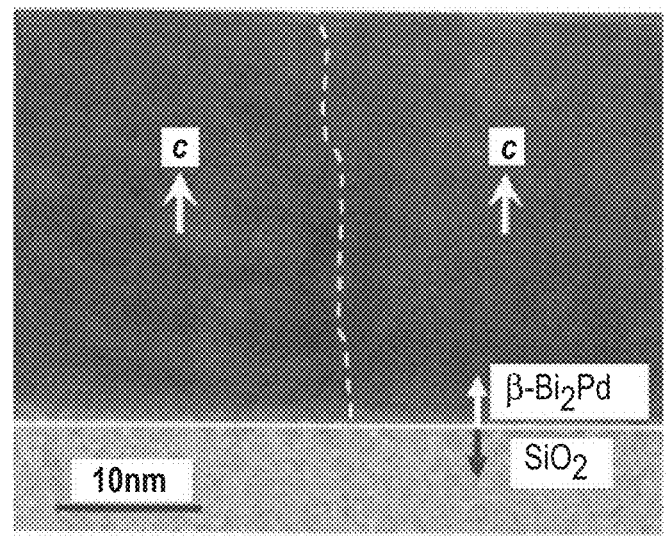
Figure 3D:
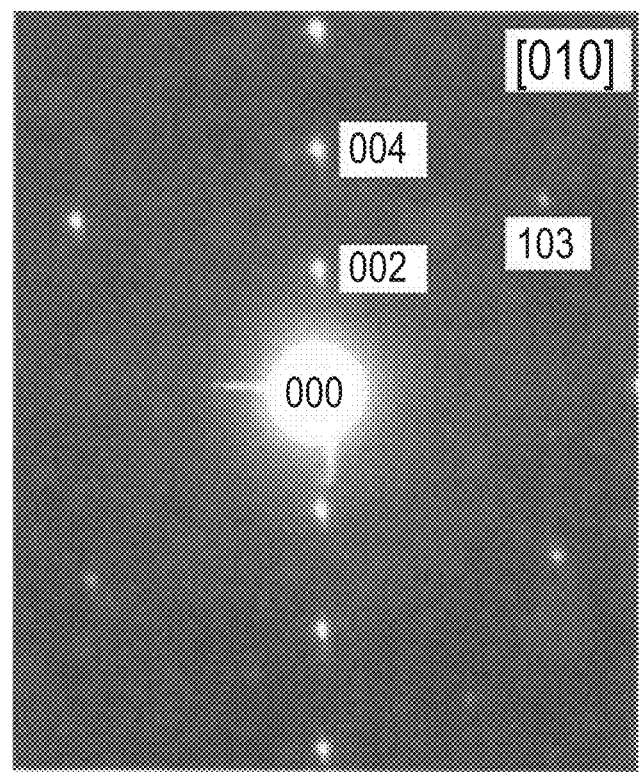

FIG. 3A is a schematic illustration of qubit device 300 (e.g., half-quantum flux qubit) according to some example embodiments. FIGS. 3B-3D are transmission electron microscopy ("TEM") images of qubit device 300 according to some example embodiments.

As shown in FIG. 3A, qubit device 300 comprises closed loop 302, but does not further comprise a magnetometer configured to detect a status of closed loop 302. Qubit device 300 is similar in construction to qubit device 100 in that closed loop 302 comprises one or more polycrystalline spin-triplet superconductors.

As also shown in FIG. 3A, arms 318 and 320 are provided to facilitate measurements of current through closed loop 302 and voltage across closed loop 302, allowing calculation of the resistance (e.g., in ohms ("1")) of closed loop 302.

The lower portion of FIG. 3A depicts qubit device 300, closed loop 302, and arms 318 and 320. The upper portion of FIG. 3A depicts a top view of qubit device 300, closed loop 302, and parts of arms 318 and 320 using a scanning electron microscope ("SEM").

The structure of qubit device 300 can include, for example, a 0.5 mm-thick silicon wafer with a 1 μm-thick thermally oxidized $SiO_x$ top layer (e.g., $SiO_2$ with possible defects due to thermal oxidation), on which thin films of β-$Bi_2$Pd are deposited, at a temperature of 400° C., using a high-vacuum sputtering system with a base vacuum of $1 \times 10^{-8}$ Torr. The thin films of β-$Bi_2$Pd can form, for example, a layer 50 nm thick on the substrate. A capping layer (e.g., a layer of MgO) can protect the thin films of β-$Bi_2$Pd. Such a capping layer can be, for example, about 1 nm thick.

The thin films of β-$Bi_2$Pd can act as a spin-triplet superconductor and a topological superconductor with a superconducting transition temperature ($T_c$) of 3.5 Kelvin ("K").

Additionally, as shown in FIG. 3A, closed loop 302 can have, for example, a width between midpoints of opposing walls of about 800 nm (e.g., 800 nm×800 nm), and a maximum wall width of about 100 nm.

Arms 318 and 320 can be used to demonstrate that the ground state of the device is $(n+_{1/2})\psi_0$ by measuring the magnetoresistance of closed loop 302 while sweeping the perpendicular external magnetic field.

FIG. 3B depicts a cross-section TEM image of (001)-textured β-$Bi_2$Pd deposited on a thermally oxidized Si(001) wafer. FIG. 3C depicts a zoomed-in view of a grain-boundary region defined by the white box in FIG. 3B. FIG. 3D depicts a selected area electron deflection pattern, over a region of the (001)-textured β-$Bi_2$Pd deposited on the thermally oxidized Si(001) wafer of FIG. 3B, with a lateral span of about 100 nm.

As shown in the TEM images in FIGS. 3B-3D, the β-$Bi_2$Pd thin films are polycrystalline. The c axis or [001] axis of the β-$Bi_2$Pd thin films are perpendicular to the film surface, without in-plane crystalline preference.

Figure 4:
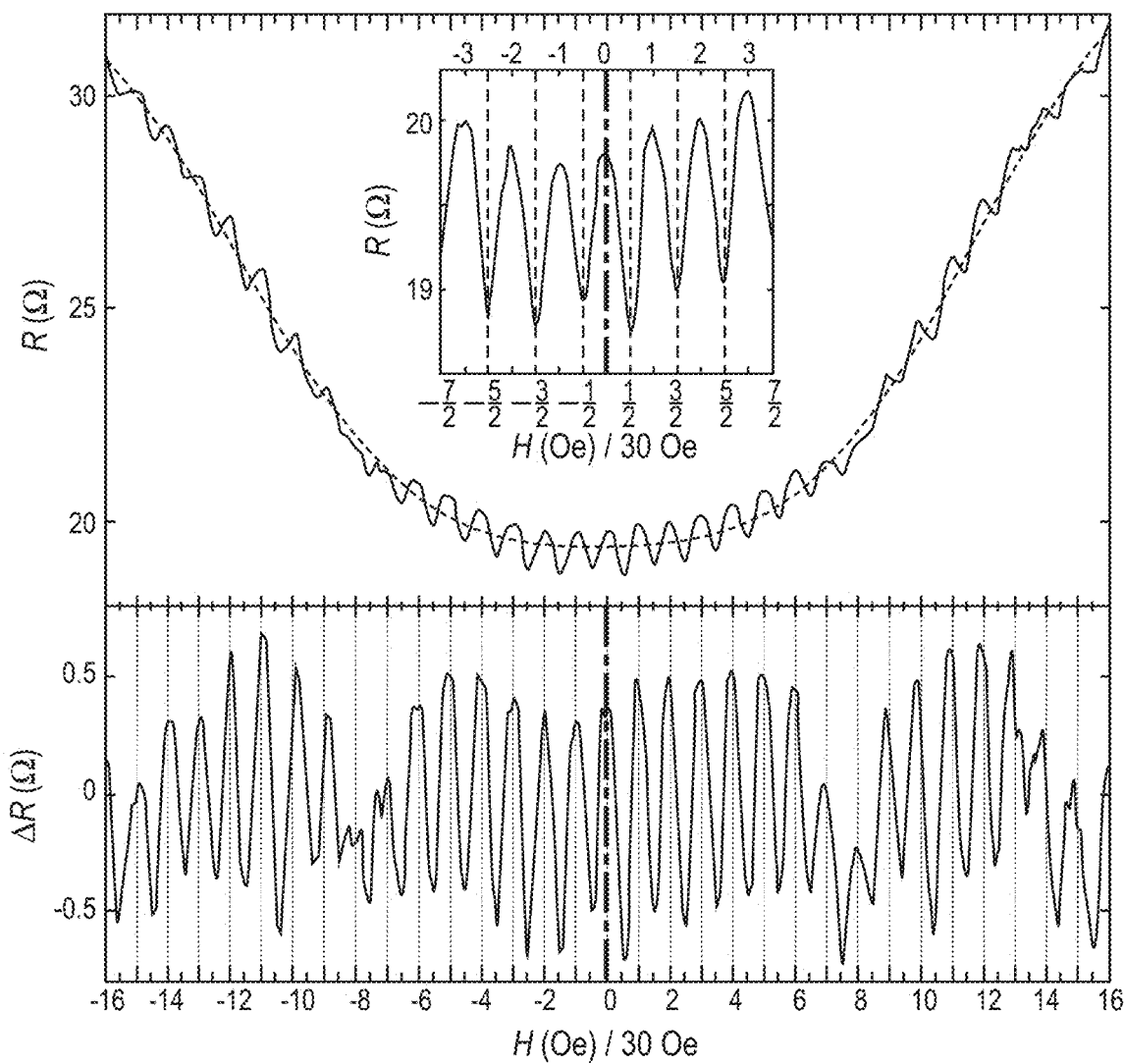
FIG. 4 is a graph depicting data obtained from the qubit device of FIGS. 3A-3D according to some example embodiments.

FIG. 4 is a graph depicting data obtained from qubit device 300 of FIGS. 3A-3D according to some example embodiments.

To demonstrate the ground state of qubit device 300 of FIG. 3A, a direct current I of 1 microamp ("μA") was applied to qubit device 300 and the resistance at various values of a perpendicularly applied external magnetic field was recorded with qubit device 300 held at a constant temperature of 2.5 K, below the superconducting transition temperature ($T_c$) of 3.5 K.

The size of qubit device 300 determines the oscillation period, in this case $\psi_0 \approx 20$ Oe-$(\mu m)^2$. For qubit device 300 of FIG. 3A (approximately 800 nm×800 nm), the resistance is expected to oscillate at a period of about 32 Oe. As shown in FIG. 4, the magnetoresistance R (Ω) oscillates with a period of about 30 Oe, in agreement with the expected value of the oscillation period.

The upper portion of FIG. 4 depicts raw data of magnetoresistance R (Ω) versus magnitude of the applied external magnetic field relative to 30 Oe, the curving dashed line within the oscillations denoting aperiodic background. The inset in the upper portion of FIG. 4 depicts a zoomed-in view of the low-field-strength region of the upper portion. The vertical dashed lines within the inset denote the applied external magnetic flux of $\psi=(n+\frac{1}{2})\psi_0$, where n=0, 1, 2, 3, etc., which correspond to the oscillation minima. The central vertical dashed line within the inset denotes zero applied external magnetic flux.

The lower portion of FIG. 4 depicts the aperiodic background subtracted from the raw data shown in the upper portion of FIG. 4, in other words the change in magnetoresistance ΔR (Ω) versus magnitude of the applied external magnetic field relative to 30 Oe. The vertical solid lines in the lower portion denote an applied external magnetic flux of $\psi=n\psi_0$, which correspond to the oscillation maxima.

The magnitude of the oscillations in the change in magnetoresistance ΔR (Ω) translates to about a 0.015 K variation in $T_c$, which is consistent with theoretical expectations for the Little-Parks effect.

FIG. 4 also depicts the signature of half-quantum flux. The minima of the magnetoresistance R (Ω), which correspond to the maxima of the superconducting transition temperature $T_c$, occur when $\psi=(n+\frac{1}{2})\psi_0$. In addition, the first resistance minima occur at about ±15 Oe, when the spontaneous circulating currents reduce to zero and half-quantum flux is sustained by the applied external magnetic field.

At a zero applied external magnetic field, the magnetoresistance R (Ω) has a maxima, which correspond to a minima of the superconducting transition temperature $T_c$. Thus, the spontaneous circulating currents are sustained in the ring to allow half-quantum flux, with even possibilities for both polarities. Thus, we can operate a half-quantum flux qubit around a zero magnetic field in qubit device 300.

Based on experimental observations, these results are not due to defect-trapped vortices. In addition, these results are robust against different field sweeping directions (e.g., ramping an external magnetic field up or down) and current densities.

Figure 5A:
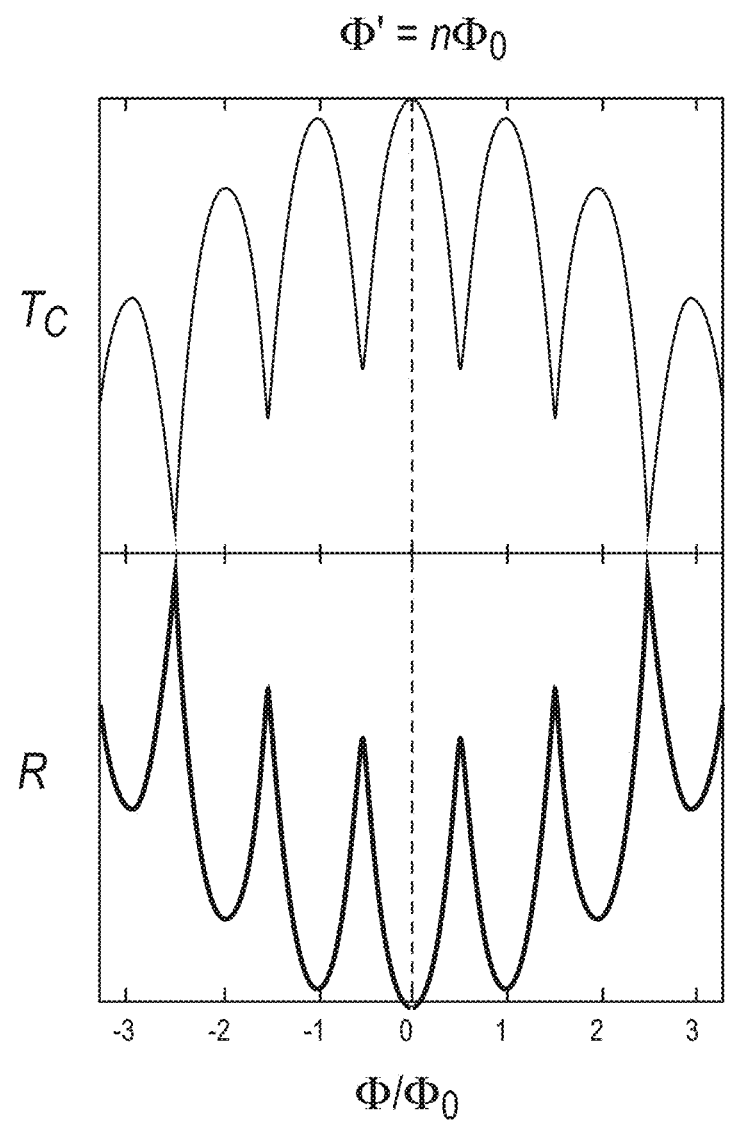
FIG. 5A is a graph depicting theoretical data from an idealized qubit device based on conventional s-wave or d-wave superconductors.

FIG. 5A is a graph depicting theoretical data from an idealized qubit device based on conventional s-wave or d-wave superconductors, in which $\psi=n\psi_0$, demonstrating the Little-Parks effect.

The upper portion of FIG. 5A depicts superconducting transition temperature ($T_c$) versus flux $\psi$ normalized to one flux quantum $\psi_0$, while the lower portion of FIG. 5A depicts magnetoresistance R (Ω) versus flux $\psi$ normalized to one flux quantum $\psi_0$. Both the superconducting transition temperature ($T_c$) and the magnetoresistance R (Ω) oscillate as a function of the applied magnetic flux with a period of one flux quantum $\psi_0$, where $\psi=n\psi_0$ (with n an integer). The mirror-image symmetry (left/right) of both graphs is apparent, as is the inverse relationship between superconducting transition temperature ($T_c$) and magnetoresistance R (Ω).

In FIG. 5A, the idealized qubit device based on conventional s-wave or d-wave superconductors should operate at an applied external magnetic field of $\psi_{ext}=\frac{1}{2}\psi_0$.

In FIG. 5A, the idealized qubit device based on conventional s-wave or d-wave superconductors should operate at an applied external magnetic field of $\psi_{ext}=\frac{1}{2}\psi_0$, which is a formidable obstacle for application of such a qubit device to a quantum computing device containing multiple such qubits, due to the need to ensure that the magnetic fields for all of the qubits are the same.

Figure 5B:
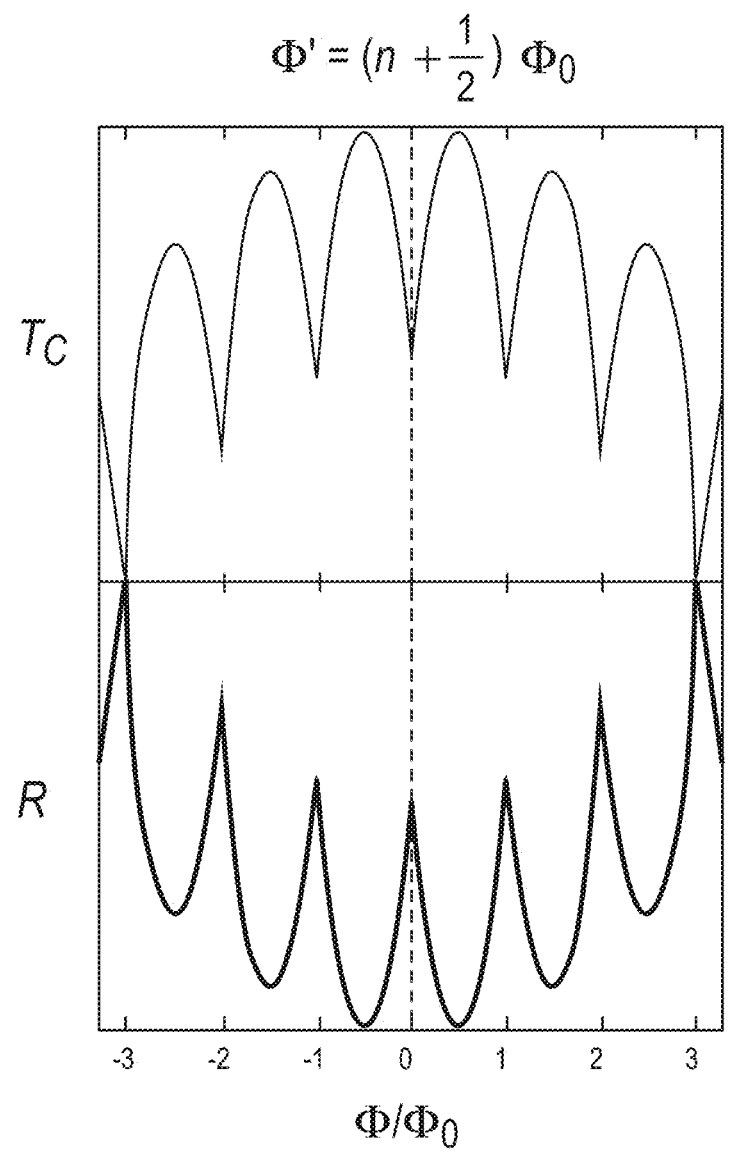
FIG. 5B is a graph depicting theoretical data from an idealized qubit device according to some example embodiments.

FIG. 5B is a graph depicting theoretical data from an idealized qubit device according to some example embodiments, in which $\psi=(n+\frac{1}{2})\psi_0$, demonstrating a phase shift of π radians in the Little-Parks effect.

The upper portion of FIG. 5B depicts superconducting transition temperature ($T_c$) versus flux $\psi$ normalized to one flux quantum $\psi_0$, while the lower portion of FIG. 5B depicts magnetoresistance R (Ω) versus flux $\psi$ normalized to one flux quantum $\psi_0$. Both the superconducting transition temperature ($T_c$) and the magnetoresistance R (Ω) oscillate as a function of the applied magnetic flux with a period of one flux quantum $\psi_0$, where $\psi=(n+\frac{1}{2})\psi_0$ (with n an integer). The mirror-image symmetry (left/right) of both graphs is apparent, as is the inverse relationship between superconducting transition temperature ($T_c$) and magnetoresistance R (Ω).

In FIG. 5B, the idealized qubit device according to some example embodiments should operate at an applied external magnetic field of $\psi_{ext}=0$, where a spontaneous supercurrent should sustain the qubit device to maintain the half quantum-flux state of $\frac{1}{2}\psi_0$.

Moreover, qubit device 300 can improve circuit integration of several flux qubits in one chip, since there will be no magnetic field required to fulfill the qubit states. On the other hand, for the conventional integer flux qubit, which will operate at $\psi_{ext}=\frac{1}{2}\psi_0$, as shown in FIG. 5A, each qubit would operate at a different applied external magnetic field because the size of each device will not be the same, as limited by current chip fabrication technology.

The qubit devices (e.g., half-quantum flux qubits) of the present application provide magnetic-field-free flux qubits for practical application in quantum computing.

Although examples have been shown and described in this specification and figures, it would be appreciated that changes may be made to the illustrated and/or described examples without departing from their principles and spirit, the scope of which is defined by the following claims and their equivalents.

The invention claimed is:

1. A qubit device, comprising:
a closed loop comprising one or more polycrystalline spin-triplet superconductors;
wherein the closed loop maintains a half-quantum magnetic flux in a ground state.

2. The qubit device of claim 1, further comprising:
a magnetometer configured to detect a status of the closed loop.

3. The qubit device of claim 2, wherein the magnetometer comprises a superconducting quantum interference device (SQUID).

4. The qubit device of claim 1, wherein a shape of the closed loop is a circle, an oval, a square, a rectangle, a quadrilateral, a pentagon, a hexagon, a heptagon, or an octagon.

5. The qubit device of claim 1, wherein a maximum overall width of the closed loop is greater than or equal to 1 nanometer (nm) and less than or equal to 1 millimeter (mm).

6. The qubit device of claim 1, wherein the one or more polycrystalline spin-triplet superconductors comprise one or more of $Bi_2Pd$, BiPd, $CaSn_3$, $Pb_2Pt$, $Sr_2RuO_4$, $PbTaSe_2$, $FeTe_xSe_{1-x}$, ($0<x\leq1$), $Cu_xBi_2Se_3$ ($0<x\leq1$), $Nb_xBi_2Se_3$ ($0<x<1$), $Sr_xBi_2Se_3$ ($0<x\leq1$), $Ir_{1-x}Pt_xTe_2$ ($0<x\leq1$), $Li_2Pt_3B$, MoN, SmN, $Li_{0.3}Ti_{1.1}S_2$, $Nb_xTc_{1-x}$ ($0<x<1$), ZrRuP, $Mo_3Al_2C$, MoC, $La_5B_2C_6$, ThIrSi, LaPtSi, $NbSe_2$, $Mo_3P$, LaRhSi, $La_3Rh_4Sn_{13}$, $CePt_3Si$, $LiPt_3B$, $UPt_3$, $CeRhSi_3$, $CeIrSi_3$, $CeCoGe_3$, $CeIrGe_3$, SrPtAs, PtAs, $URu_2Si_2$, ($Li_xFe_{1-x}$)OHFeSe ($0<x\leq1$), Li(Fe,Co)As, $Pb_3Bi$, $U_{1-x}Th_xBe_{13}$($0\leq x\leq1$), YPtBi, LuPtBi, LaPtBi, YPdBi, LuPdBi, ErPdBi, DyPdBi, TmPdBi, SmPdBi, HoPdBi, or CePdBi.

7. The qubit device of claim 1, wherein the one or more polycrystalline spin-triplet superconductors comprise β-$Bi_2Pd$.

8. The qubit device of claim 1, wherein the half-quantum magnetic flux in the ground state is about $1.033917\times10^{-15}$ webers (Wb).

9. The qubit device of claim 1, wherein a fluxoid quantization ($\Psi$) of the closed loop satisfies Equation I:

$$\Psi=(n+\frac{1}{2})*\Psi_0 \tag{Equation I}$$

where 'n' is a whole number,
where '$\Psi 0$' =h/(2*e),
where 'h' is Planck's constant,
where 'e' is a charge on one electron, and
all units are in the International System of Units (SI).

10. A qubit device, comprising:
a closed loop comprising one or more single crystalline spin-triplet superconductors connected by one or more s-wave superconductors;
wherein the closed loop maintains a half-quantum magnetic flux in a ground state.

11. The qubit device of claim 10, further comprising:
a magnetometer configured to detect a status of the closed loop.

12. The qubit device of claim 11, wherein the magnetometer comprises a superconducting quantum interference device (SQUID).

13. The qubit device of claim 10, wherein a shape of the closed loop is a circle, an oval, a square, a rectangle, a quadrilateral, a pentagon, a hexagon, a heptagon, or an octagon.

14. The qubit device of claim 10, wherein a maximum overall width of the closed loop is greater than or equal to 1 nanometer (nm) and less than or equal to 1 millimeter (mm).

15. The qubit device of claim 10, wherein the one or more one or more single crystalline spin-triplet superconductors comprise one or more of $Bi_2Pd$, BiPd, $CaSn_3$, $Pb_2Pt$, $Sr_2RuO_4$, $PbTaSe_2$, $FeTe_xSe_{1-x}$, (0<x≤1), $Cu_xBi_2Se_3$ (0<x≤1), $Nb_xBi_2Se_3$ (0<x≤1), $Sr_xBi_2Se_3$ (0<x≤1), $Ir_{1-x}Pt_xTe_2$ (0<x≤1), $Li_2Pt_3B$, MoN, SmN, $Li_{0.3}Ti_{1.1}S_2$, $Nb_xTc_{1-x}$ (0<x<1), ZrRuP, $Mo_3Al_2C$, MoC, $La_5B_2C_6$, ThIrSi, LaPtSi, $NbSe_2$, $Mo_3P$, LaRhSi, $La_3Rh_4Sn_{13}$, $CePt_3Si$, $LiPt_3B$, $UPt_3$, $CeRhSi_3$, $CeIrSi_3$, $CeCoGe_3$, $CeIrGe_3$, SrPtAs, PtAs, $URu_2Si_2$, $(Li_xFe_{1-x})OHFeSe$ (0<x≤1), Li(Fe,Co)As, $Pb_3Bi$, $U_{1-x}Th_xBe_{13}$ (0≤x≤1), YPtBi, LuPtBi, LaPtBi, YPdBi, LuPdBi, ErPdBi, DyPdBi, TmPdBi, SmPdBi, HoPdBi, or CePdBi.

16. The qubit device of claim 10, wherein the one or more single crystalline spin-triplet superconductors comprise β-$Bi_2Pd$.

17. The qubit device of claim 10, wherein the one or more s-wave superconductors comprise one or more of Al, Nb, Pb, Sn, Ta, or one or more alloys of Al, Nb, Pb, Sn, or Ta.

18. The qubit device of claim 10, wherein the half-quantum magnetic flux in the ground state is about $1.033917 \times 10^{-15}$ webers (Wb).

19. The qubit device of claim 10, wherein a fluxoid quantization ($\Psi$) of the closed loop satisfies Equation I:

$$\Psi = (n+1;2)* \Psi 0 \quad \text{(Equation I)}$$

where 'n' is a whole number,
where '$\Psi 0$' =h/(2*e),
where 'h' is Planck's constant,
where 'e' is a charge on one electron, and
all units are in the International System of Units (SI).

20. The qubit device of claim 10, wherein an odd number of connections between the one or more single crystalline spin-triplet superconductors and the one or more s-wave superconductors are π-junctions.

* * * * *

UNITED STATES PATENT AND TRADEMARK OFFICE
CERTIFICATE OF CORRECTION

PATENT NO. : 11,995,516 B2
APPLICATION NO. : 17/610395
DATED : May 28, 2024
INVENTOR(S) : Yufan Li et al.

It is certified that error appears in the above-identified patent and that said Letters Patent is hereby corrected as shown below:

In the Claims

At Column 14, Line 48, "FeTexSe1-x," should be --FeTe$_x$Se$_{1-x}$--;

At Column 14, Line 51, "Th1rSi" should be --ThIrSi--;

At Column 15, Line 29, "FeTexSe1-x," should be --FeTe$_x$Se$_{1-x}$--;

At Column 16, Line 20, "1;2" should be --1/2--.

Signed and Sealed this
Ninth Day of July, 2024

Katherine Kelly Vidal
Director of the United States Patent and Trademark Office